(12) United States Patent
Schaeufele et al.

(10) Patent No.: US 11,894,836 B2
(45) Date of Patent: Feb. 6, 2024

(54) ELECTRO ACOUSTIC RF FILTER WITH IMPEDANCE ELEMENT HAVING IMPROVED PERFORMANCE AND MULTIPLEXER COMPONENT COMPRISING THE FILTER

(71) Applicant: RF360 SINGAPORE PTE. LTD., Singapore (SG)

(72) Inventors: Ansgar Schaeufele, Munich (DE); Thomas Bauer, Munich (DE); Gholamreza Dadgar Javid, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 431 days.

(21) Appl. No.: 17/275,437

(22) PCT Filed: Oct. 15, 2019

(86) PCT No.: PCT/EP2019/077912
§ 371 (c)(1),
(2) Date: Mar. 11, 2021

(87) PCT Pub. No.: WO2020/078971
PCT Pub. Date: Apr. 23, 2020

(65) Prior Publication Data
US 2022/0052669 A1 Feb. 17, 2022

(30) Foreign Application Priority Data
Oct. 15, 2018 (DE) ..................... 10 2018 125 498.9

(51) Int. Cl.
*H03H 9/64* (2006.01)
*H03H 9/25* (2006.01)

(52) U.S. Cl.
CPC ............ *H03H 9/6483* (2013.01); *H03H 9/25* (2013.01); *H03H 9/6493* (2013.01)

(58) Field of Classification Search
CPC ....... H03H 9/6483; H03H 9/25; H03H 9/6493
See application file for complete search history.

(56) References Cited

U.S. PATENT DOCUMENTS

| | | | |
|---|---|---|---|
| 7,002,281 B2 * | 2/2006 | Andle | H03H 9/42 310/313 B |
| 7,298,067 B1 * | 11/2007 | Kosinski | H03H 9/1014 310/341 |

(Continued)

FOREIGN PATENT DOCUMENTS

| | | | | |
|---|---|---|---|---|
| DE | 112019005403 T5 * | 7/2021 | | H03H 3/02 |
| EP | 0963000 A2 * | 12/1999 | | |

(Continued)

OTHER PUBLICATIONS

Bauer T., et al., "A Bright Outlook for Acoustic Filtering: A New Generation of Very Low-Profile Saw, TC SAW and BAW Devices for Module Integration," IEEE Microwave Magazine, vol. 16 (7), Aug. 2015 (Aug. 2015), pp. 73-81, XP011662656, [retrieved on Jul. 8, 2015], figures 4-6, sections"Temperature Variation", "Enhanced Filter Performance InImproved Package Technology", "Integration into Modules"; p. 76-p. 78; figures 5,6.

(Continued)

*Primary Examiner* — Adam D Houston
(74) *Attorney, Agent, or Firm* — Polsinelli (57) ABSTRACT

An improved electro acoustic RF filter (FC) is provided. The RF filter comprises an electro acoustic resonator (EAR) connected between an input port and an output port, an impedance element and a damping and/or dissipation element (DE) in mechanical contact to the impedance element. The damping and/or dissipation element is provided and configured to remove acoustic energy from the impedance (Continued)

element which has a similar construction as the resonator on the same substrate. With such a construction an acoustically inactive impedance element (AIIE) is obtained.

10 Claims, 4 Drawing Sheets

(56) References Cited

U.S. PATENT DOCUMENTS

| | | |
|---|---|---|
| 2005/0231306 A1 | 10/2005 | Kushitani et al. |
| 2006/0169672 A1* | 8/2006 | Toyoda ............... H05K 3/1208 |
| | | 216/62 |
| 2008/0129418 A1 | 6/2008 | Miura et al. |
| 2014/0085020 A1 | 3/2014 | Reinhardt et al. |
| 2017/0264257 A1 | 9/2017 | Reinhardt et al. |
| 2017/0359051 A1 | 12/2017 | Urata |
| 2020/0395916 A1* | 12/2020 | Kushnir .................. H03H 9/46 |
| 2021/0135648 A1* | 5/2021 | Trindade ............ H03H 9/02362 |
| 2021/0135649 A1* | 5/2021 | Trindade ............. H03H 9/2452 |
| 2022/0052669 A1* | 2/2022 | Schäufele ............ H03H 9/6493 |
| 2023/0216478 A1* | 7/2023 | Caron .................... H03H 9/542 |
| | | 333/187 |

FOREIGN PATENT DOCUMENTS

| | | | | |
|---|---|---|---|---|
| EP | 1258989 B1 | * | 5/2008 | ............. H03H 3/013 |
| JP | 2020108145 A | * | 7/2020 | ........... H01L 41/047 |
| KR | 20190128202 A | * | 11/2019 | |
| WO | WO-2017176827 A1 | * | 10/2017 | ............... B07B 1/52 |

OTHER PUBLICATIONS

International Search Report and Written Opinion—PCT/EP2019/077912—ISA/EPO—dated Jan. 22, 2020.

* cited by examiner

ELECTRO ACOUSTIC RF FILTER WITH IMPEDANCE ELEMENT HAVING IMPROVED PERFORMANCE AND MULTIPLEXER COMPONENT COMPRISING THE FILTER

The present invention refers to electro acoustic RF filters and to multiplexer components that can comprise such filters. The electro acoustic RF filters have an improved filter performance and can be realized with a reduced chip space requirement.

The RF filters can be used in devices for mobile or wireless communication systems. Electro acoustic RF filters have electro acoustic resonators and further circuit elements. The electro acoustic resonators can use the piezoelectric effect to convert between electromagnetic RF signals and acoustic waves. However, it may be necessary that respective other circuit components are pure electric components that are acoustically inactive.

Conventional RF filters can comprise SAW resonators (SAW=surface acoustic wave), BAW resonators (BAW=bulk acoustic wave) or GBAW resonators (GBAW=guided bulk acoustic wave). SAW resonators and GBAW resonators have interdigitated electrode structures arranged on a piezoelectric material. BAW resonators have a sandwich construction comprising a bottom electrode, a top electrode and a piezoelectric material between the bottom electrode and the top electrode. When acoustic effects are neglected then BAW resonators, SAW resonators and GBAW resonators can be regarded as capacitance elements. Thus, it is possible to use structures similar to the acoustically active structures as impedance elements such as capacitance elements.

The use of such structures as capacitance elements reduces fabrication efforts. However, in conventional RF filters such capacitance elements, that should be idealized electric capacitance elements without an acoustic activity, appear to show unwanted acoustic activity resulting in a performance degradation of the corresponding RF filter.

Conventional RF filters reduce the acoustic activity of such pure capacitance elements by rotating the corresponding interdigitated structures relative to the piezoelectric axis of the piezoelectric material to reduce the electro acoustic coupling factor κ2. Further, it is possible to shift acoustic resonance frequencies of circuit elements that should be acoustically inactive to frequency ranges away from working frequency ranges of the RF filter.

However, each of these approaches has certain disadvantages. For example, an altered pitch of an IDT structure results in an increased electrode finger resistance loss and increased manufacturing efforts, e.g. when smaller tolerances are involved.

Thus, it is an object of the present invention to provide RF filters with an improved filter performance. In particular, it is an object of the present invention to reduce the contribution of acoustic activity of circuit elements that should be acoustically inactive.

Correspondingly, it is an object of the present invention to reduce unwanted acoustic resonances in RF filters and to provide a corresponding filter component such as a multiplexer component, for example a duplexer component having such an RF filter.

To that end an electro acoustic RF filter according to independent claim 1 is provided. Dependent claims provide preferred embodiments.

The electro acoustic RF filter comprises an input port and an output port. Further, the filter has an electro acoustic resonator electrically connected between the input port and the output port. Further, the electro acoustic RF filter has an acoustically inactive impedance element electrically coupled to the electro acoustic resonator. Additionally, the filter has a damping and/or dissipation element connected to the acoustically inactive impedance element. The damping and/or dissipation element is provided and configured to remove acoustic energy from the inactive impedance element by either dissipation of acoustic energy, or by reducing the coupling or by suppressing an acoustic mode This can be obtained, for example, by suppressing or preventing accumulation of acoustic energy in the inactive impedance element. This can be obtained, for example, by either an increased dissipation of energy, or by a reduced electroacoustic excitation, i.e. a reduced coupling.

Electroacoustic coupling can even be completely deactivated by the one or more damping and/or dissipation elements leading to a cut-off of the respective acoustic mode all frequency ranges of interest.

Thus, an electro acoustic RF filter is provided where a damping and/or dissipation element is used to remove acoustic energy from an impedance element that should be acoustically inactive in order to reduce unwanted acoustic effects on the performance of the RF filter.

The RF filter can comprise further electro acoustic resonators connected between the input port and the output port. The electro acoustic resonators can be coupled in a ladder-type like circuit topology with series resonators electrically connected in series between the input port and the output port. Parallel resonators in shunt paths electrically connect the signal path to a ground potential.

Further, lattice-type like circuit topologies comprising the one electro acoustic resonator or several electro acoustic resonators are also possible. In addition to one-port resonators, also multiport resonators or DMS (Double-Mode-SAW) resonators can be used.

The acoustically inactive impedance element can be electrically coupled to one or several of the electro acoustic resonators. However, it is also possible that the acoustically inactive impedance element is directly connected to at least one port of one electro acoustic resonator. The acoustically inactive impedance element can be an impedance element of an impedance matching circuit or of similar circuits. Capacitance elements are also often used to increase the skirt steepness of a filter by reducing the distance between resonance and anti resonance of a resonator, to which it is connected in parallel.

The damping and/or dissipation element connected to the acoustically inactive impedance element can be directly and physically connected to the acoustically inactive impedance element such that a good energy transfer from the acoustically inactive impedance element to the damping and/or dissipation element is possible. Then, the damping and/or dissipation element can act as a dissipation element. Correspondingly, the term "inactive" means that the corresponding impedance element should have an acoustic activity that is as low as possible.

The present electro acoustic RF filter is, thus, different from conventional RF filters where IDT or sandwich structures are decoupled from their environment as much as possible to avoid energy dissipation. Thus, conventional RF filters comprise a housing where the IDT or the sandwich structure can be arranged in a cavity below a cap or a protective layer.

It is possible that the acoustically inactive impedance element is a capacitance element or an inductance element.

In particular, it is possible that the acoustically inactive impedance element is a capacitance element and that electrode structures of the capacitance element have a similar construction to electrode structures of the electro acoustic resonator because then similar manufacturing steps for establishing the resonator and the acoustically inactive capacitance element can be utilized.

It is to be noted that the damping and/or dissipation element does not necessarily need to remove as much acoustic energy as possible. In particular it is sufficient that the accumulation of acoustic energy at a specific frequency range is prevented or reduced. The frequency range can especially be the working frequency range of the electro acoustic RF filter, or the frequency range of any other filter to which it is connected in a multiplexer environment, especially for carrier aggregation.

Correspondingly, it is possible that the electro acoustic resonator is a SAW resonator, a BAW resonator or a GBAW resonator. Further, it is possible that the acoustically inactive impedance element comprises an interdigitated electrode structure or two electrodes separated by a dielectric layer between the electrodes.

It is possible that the damping and/or dissipation element prevents or reduces accumulation of acoustic energy by leading the acoustic energy in a direction away from the structures. Thus, it is possible that the damping and/or dissipation element conducts acoustic energy into a carrier substrate or into elements of the housing of the RF filter where no further performance degradation is possible. However, it is also possible that the damping and/or dissipation element obtains a reduced accumulation of acoustic energy by other means. Thus, it is possible that the damping and/or dissipation element prevents accumulation of acoustic energy in the specific frequency range by detuning the electrode structure of the acoustically inactive impedance element.

It is also possible to use a damping and/or dissipation element which works in the way that it either considerably reduces the electroacoustic excitation of an acoustic mode, i.e. the coupling is reduced. Furthermore, the excitation of a mode can be completely eliminated by making use of cut-off conditions.

If the acoustically inactive impedance element has an interdigitated structure with interdigitated electrode fingers similar to a SAW resonator then the damping and/or dissipation element can comprise a layer of a material arranged below or above the electrode fingers of the IDT structure. It is also possible that the damping and/or dissipation element comprises a dielectric element arranged between the corresponding electrode fingers. With its increased or reduced mass loading and/or with its specific mechanical stiffness parameters and the corresponding detuning, accumulation of acoustic energy in a specific frequency range can be reduced by shifting the corresponding acoustic energy to another location in space or to another frequency range or both.

If the acoustically inactive impedance element has a sandwich-like structure similar to that of a BAW resonator, then the damping and/or dissipation element can comprise material of a layer arranged below the bottom electrode or above the top electrode or material between the bottom electrode and the top electrode.

It is correspondingly possible that the electro acoustic resonator has a first layer construction and the acoustically inactive impedance element has a second layer construction. The first layer construction and the second layer construction differ in at least one parameter selected from the number of layers, the thickness of a layer, the material of a layer and the viscosity of a layer.

It is also possible that the acoustically inactive impedance element has an orientation rotated relative to an orientation of the electro acoustic resonator to further reduce the electro acoustic coupling coefficient κ2.

It is possible that the damping and/or dissipation element has a higher viscosity than a material in the direct vicinity of the electro acoustic resonator.

In this respect the material in the direct vicinity of the electro acoustic resonator can be in direct contact with a structure of the electro acoustic resonator, e.g. with an electrode structure of the resonator.

It is possible that the electro acoustic resonator is arranged in a housing based on a packaging technology selected from a TFAP packaging, a CSSP packaging, a CSSP plus packaging, a DSSP packaging.

A TFAP packaging (TFAP=thin film acoustic packaging) utilizes a thin film to protect sensitive structures against unwanted environmental influences. The thin film is characterized in that thin film material deposition techniques such as PVD (physical vapor deposition), (CVD=chemical vapor deposition) or MBE (molecular beam epitaxy) material deposition techniques are used to create the thin film. A CSSP packaging (CSSP=chip sized SAW packaging) uses a cap to protect the sensitive resonator structures. A CCSSP plus packaging is an improved version of the CSSP packaging. A DSSP packaging (DSSP=die sized SAW packaging) uses a wafer material for a cap to protect sensitive structures.

The thin film package can have a protection film with a thickness between 1 μm and 20 μm. In contrast, finger structures can have widths in the range from 100 nm to 1 μm.

It is possible that an element of the housing establishes the damping and/or dissipation element.

Thus, instead of increasing the complexity of manufacturing processes by adding additional layers or additional material to the corresponding component, existing materials or existing elements can be arranged to be in direct contact with the acoustically inactive impedance element to prevent accumulation of acoustic energy in the corresponding frequency range. Thus, the damping and/or dissipation element can be a layer or a segment of the layer of a CSSP package, of a CSSP plus package, of a DSSP package or of a TFAP package or of another type of package.

In particular, it is possible to arrange a thin film of a TFAP at a distance above the electro acoustic resonator and directly on the acoustically inactive impedance element.

It is also possible to provide a cavity above and/or below the resonator structures and the package and/or to provide an additional cavity above and/or below the acoustically inactive impedance element and its package. But the cavity between the acoustically inactive impedance element and its housing elements can be filled with a specific material that has advantageous acoustic, i.e. viscous, and/or stiffness and density parameters. Thus, the cavity can be filled with a specific atmosphere at a specific pressure, filled with a liquid or with a gel. In particular liquids that are necessary during manufacturing steps can be used. In particular, it is further possible to simplify manufacturing steps by just omitting protective means from the place of the acoustically inactive impedance element that are applied at the place of the resonator to protect the resonator from processing materials during manufacturing steps.

It is possible that the acoustically inactive circuit element is directly covered by an element of the housing. This is possible by omitting the corresponding cavity that is necessary above the resonator structure.

Correspondingly, it is possible to utilize one or more of the above-described electro acoustic filters in a multiplexer, e.g. in a duplexer, triplexer, a quadplexer or a multiplexer of a higher degree.

Thus, RF filters and multiplexer components with improved electric performance are provided. The electric performance is enhanced by suppressing acoustic resonances of impedance elements that should be ideal electric impedance elements. Acoustic resonances of such impedance elements are suppressed or reduced by removing acoustic energy from the impedance elements in the corresponding frequency range. The above-described means for improving the performance of the filter can be applied with only a small increase in complexity of the manufacturing processes or even with a reduced complexity of the manufacturing processes. The means do not need additional space, in embodiments where cavities are omitted even less chip space is required. Thus, the provided electro acoustic filter is compatible with the ongoing trend towards miniaturization. Especially when the number of cavities is reduced or when cavities are filled with material then the physical stability of the corresponding component, especially against a force applied in a vertical direction, is increased.

Especially when corresponding RF filters are implemented in multiplexers such as duplexers or multiplexers of a higher degree and especially when the corresponding multiplexers should be used in a carrier aggregation working mode, then not only the passbands of the RF filters but also the performance in neighboring frequency ranges is important. The damping and/or dissipation element cannot only improve the frequency characteristic within a passband or within a rejection band, but also in frequency ranges above and below a passband to improve the cooperation of the corresponding RF filter in a multiplexer with respective other RF filters. For example, the improvement shown in FIG. 9 allows the use of corresponding RF filters in a multiplexer that is provided for the combination of bands 41 and 7.

The location, arrangement, orientation of the damping and/or dissipation element and its corresponding material parameters such as elasticity tensor and density can be chosen such that resonances in a specific frequency range can be eliminated or shifted such that a plurality of corresponding frequency bands can be utilized within a single multiplexer or with a reduced number of filters in a multiplexer.

Central aspects of the electro acoustic RF filters together with their working principles and details of preferred embodiments are shown in the accompanying schematic figures.

Figure 1:
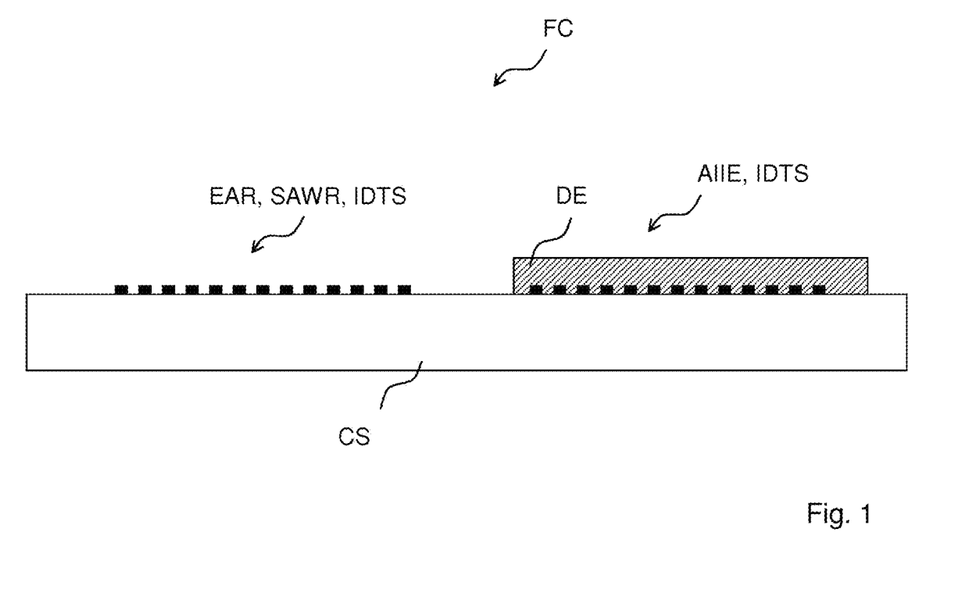
FIG. 1 shows technical details of the basic construction of a filter component FC.

FIG. 1 shows technical details of a filter component FC where a damping and/or dissipation element DE prevents or reduces accumulation of acoustic energy at the location of an acoustically inactive impedance element AIIE at least in a specific frequency range. The component has a carrier substrate CS. On the carrier substrate CS structures of an electro acoustic resonator EAR are arranged. The structures shown in the embodiment of FIG. 1 are interdigitated structures IDTS of a SAW resonator SAWR. The structures comprise interdigitated electrode structures arranged on a piezoelectric material. The piezoelectric effect is utilized to convert between acoustic waves and electromagnetic RF signals. To work properly an electro acoustic resonator EAR needs an acoustic isolation of the vibrating structures.

In contrast, structures of the acoustically inactive impedance element AIIE are in mechanical contact with the material of the damping and/or dissipation element DE such that an acoustic resonance is prevented or strongly reduced. The filter component FC shown in FIG. 1 utilizes electrode structures provided as interdigitated structures IDTS to establish a capacitance element as acoustically inactive inductance element AIIE.

The stiffness and viscosity parameters of the material of the damping and/or dissipation element DE and its density are chosen such that accumulation of acoustic energy in the respective critical frequency range is prevented or strongly reduced. The critical frequency range can be the range around a center frequency of a passband or of a rejection band of the filter, or in a carrier aggregation band for a multiplexer case.

Figure 2:
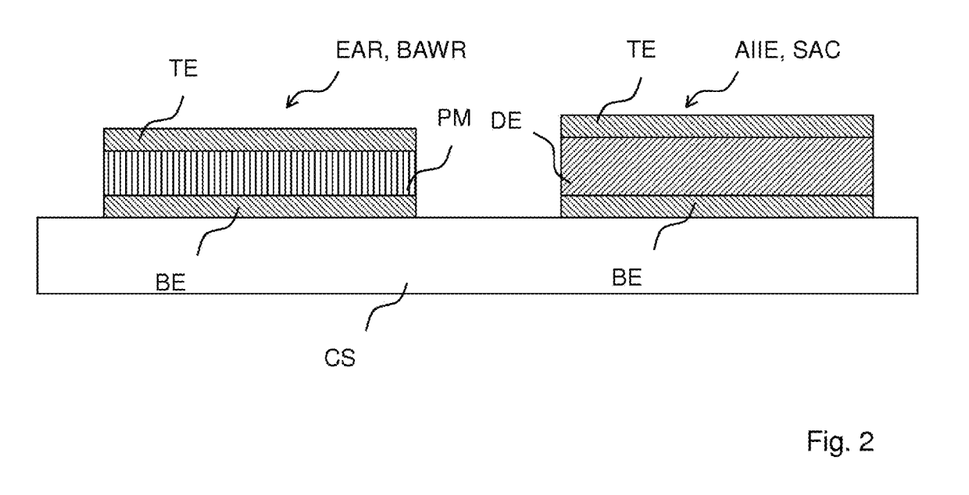
FIG. 2 shows filter components based on BAW structures.

While FIG. 1 illustrates resonator structures and impedance structures with interdigitated electrode fingers, FIG. 2 shows resonator structures and inductance element structures based on a BAW construction. On a carrier substrate CS an acoustically active resonator EAR is arranged. The resonator EAR is provided as a BAW resonator BAWR. The resonator has a bottom electrode BE and a top electrode TE. Between the bottom electrode BE and the top electrode TE a piezoelectric material PM is arranged.

The resonator EAR is electrically coupled to the acoustically inactive impedance element AIIE. The impedance element is provided in the form of a sandwich construction SAC comprising a bottom electrode BE and a top electrode TE. Between the bottom electrode BE and the top electrode TE a dielectric material is arranged. The dielectric material, or at least a part of the dielectric material, is realized by the damping and/or dissipation element DE. The provision of the damping and/or dissipation element DE results in a reduced accumulation of acoustic energy at the place of the impedance element AIIE in the specific frequency range. The construction of the impedance element is similar to the construction of the resonator.

Correspondingly, at least some of the manufacturing steps for manufacturing the resonator can be utilized to establish the impedance element. Accumulation of acoustic energy in the corresponding frequency range can be prevented or reduced by altering the thickness of the dielectric material between the bottom electrode BE and the top electrode TE.

Figure 3:
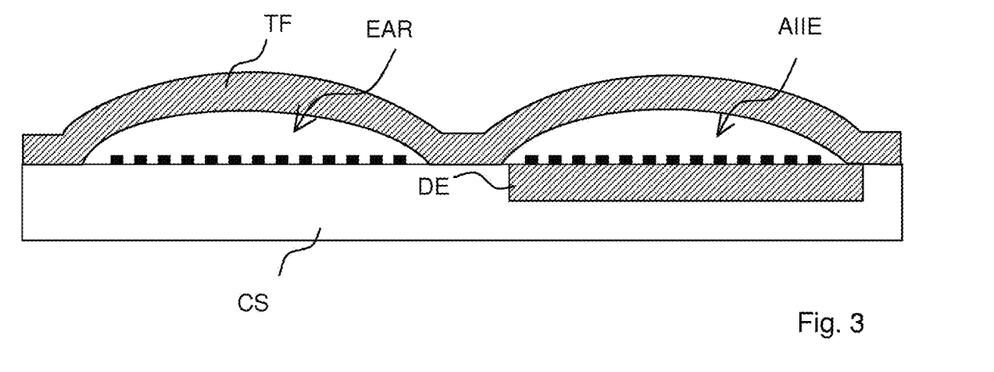
FIG. 3 shows the use of a thin film package.

FIG. 3 illustrates the possibility of utilizing a thin film TF to protect sensitive structures of the electro acoustic resonator EAR. The same thin film can be used to also protect the structures of the acoustically inactive impedance element AIIE. Material of the damping and/or dissipation element DE can be arranged below the electrode structures of the impedance element. Material of the damping and/or dissipation element DE can be embedded in a carrier substrate below the electrode structures of the impedance element. However, it is also possible to arrange the material of the dielectric element DE on the top surface of the carrier substrate and to arrange the electrode structures of the impedance element on the material of the damping and/or dissipation element above the top surface of the carrier substrate CS.

Figure 4:
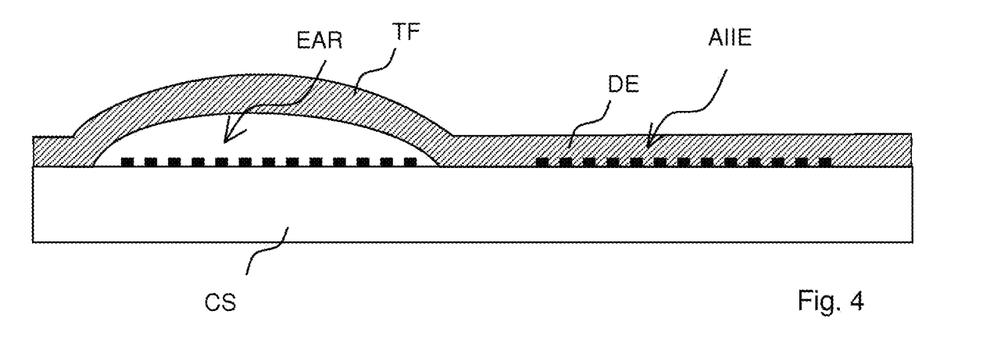
FIG. 4 shows a section of a thin film used as a damping and/or dissipation element.

FIG. 4 illustrates details of an embodiment where material of the thin film TF is utilized as the damping and/or dissipation element DE. This material is in direct contact with the electrode structures of the acoustically inactive impedance element AIIE. The direct contact improves the efficiency of conducting acoustic energy away from the impedance element. Alternatively, the DE can also reduce the electroacoustic excitation. Additionally to the improved performance, the size of the AIIE can be reduced because safety margins between thin film landing and IDT structures are no longer required.

Figure 5:
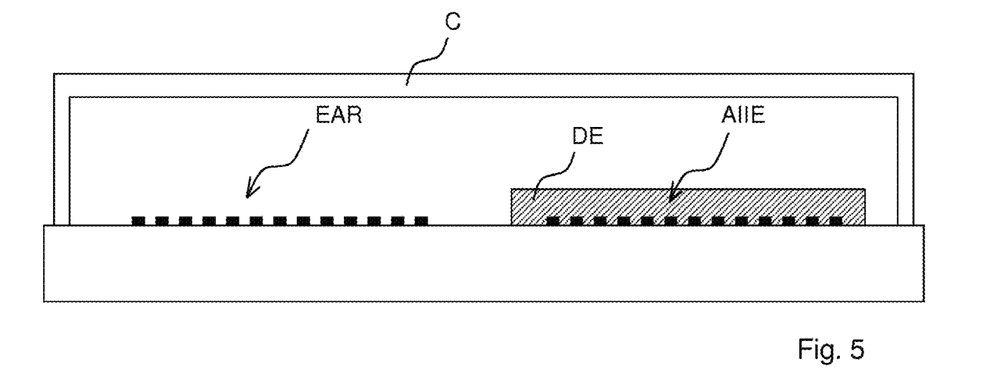
FIG. 5 shows the compatibility with conventional packaging technologies.

However, the application of the damping and/or dissipation element DE is also compatible with other housing technologies. Correspondingly, FIG. 5 shows technical details of a filter circuit where a conventional cap C is utilized to protect the sensitive electrode structures of the electro acoustic resonator EAR. Within the same cavity, the structures of the impedance element AIIE together with the material of the damping and/or dissipation element DE can be arranged.

Figure 6:
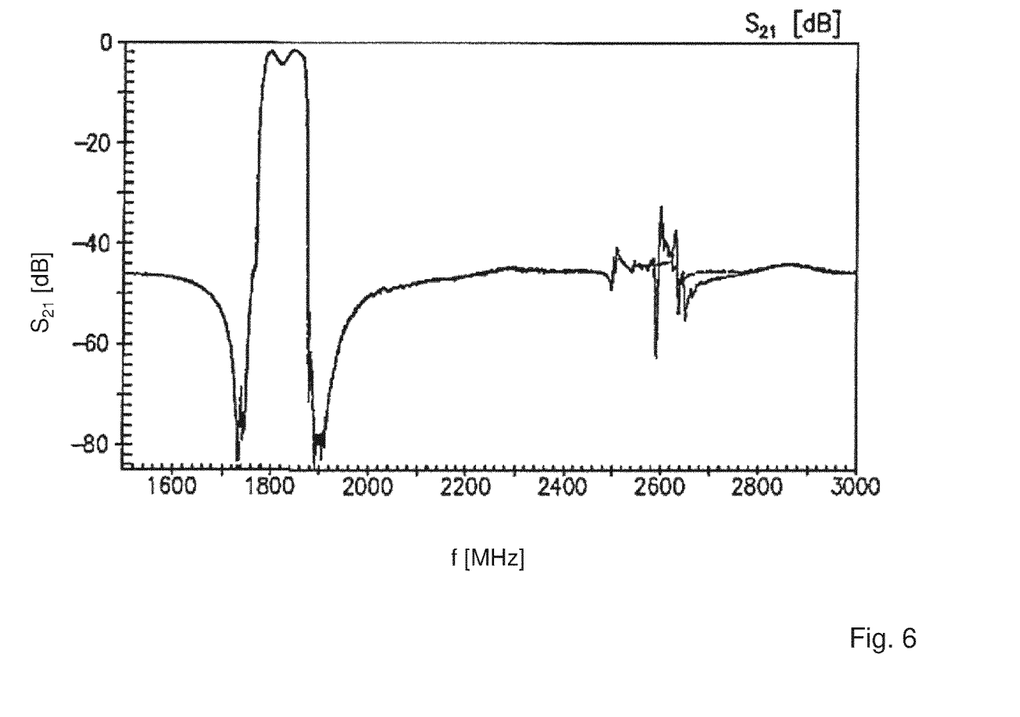
FIG. 6 shows a comparison of transfer functions of a conventional filter and of an RF filter as described above.

FIG. 6 illustrates a comparison of the transfer function S21 of a conventional electro acoustic bandpass filter and the transfer function of an electro acoustic RF filter comprising a damping and/or dissipation element in direct contact with an impedance element. It can be clearly seen that in the range of the passband around 1800 MHz the transfer function remains unchanged. However, a resonance establishing a distortion in the transfer function of the conventional filter at around 2600 MHz is strongly reduced. The filter component, of which the improved transfer function in FIG. 6 is shown, bases on a filter component with a TFAP package where the material of the thin film is in direct contact with the structures of the impedance element as shown in FIG. 4.

Figure 7:
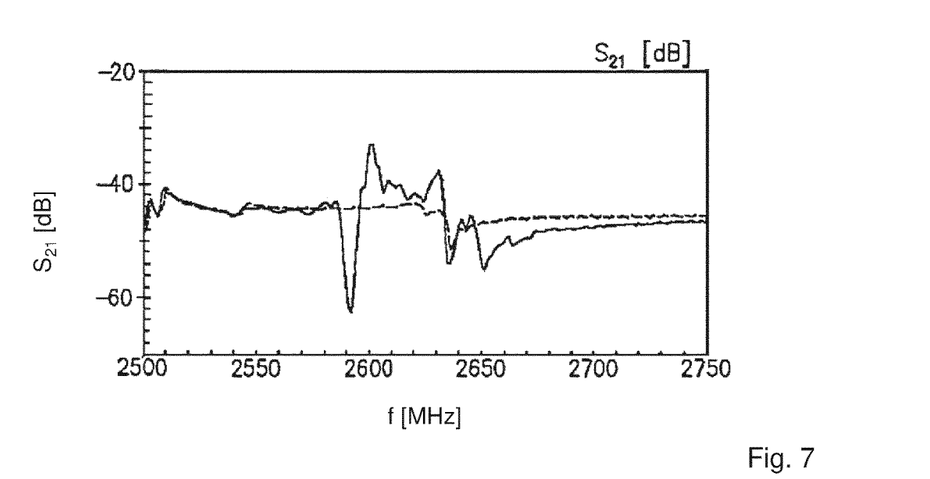
FIG. 7 shows the different transfer functions in a specific frequency range.

FIG. 7 shows the corresponding critical frequency range around 2600 MHz in an enlarged view. The solid line shows the transfer function of the conventional filter component. The dashed line shows the improved transfer function according to the improved RF filter.

Figure 8:
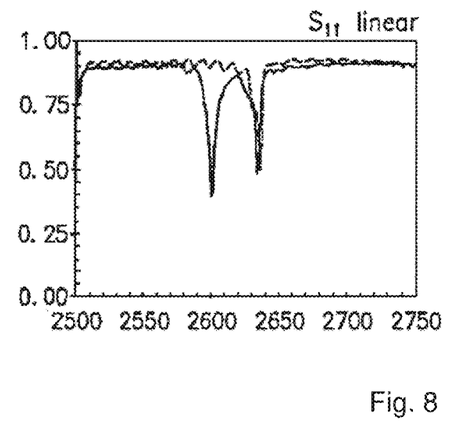
FIG. 8 shows a comparison of the input reflection coefficients of a conventional filter and of a filter as described above in a specific frequency range.

For the same critical frequency range FIG. 8 shows the input reflection coefficient S11 of the conventional filter (solid line) and of the improved filter (dashed line). The conventional filter has two frequencies where the reflection coefficient is significantly reduced. One of the two significant reductions in a reflection coefficient is eliminated in the improved electro acoustic RF filter.

Figure 9:
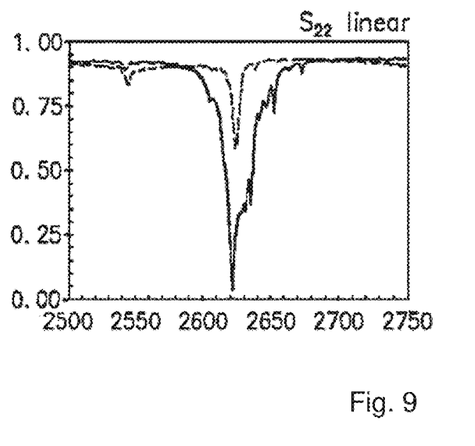
FIG. 9 shows a comparison between the output reflections coefficients of a conventional RF filter and of an RF filter as described above.

Correspondingly, FIG. 9 shows the output reflection coefficient in the critical frequency range. The solid line shows a significant reduction of the reflection coefficient between 2600 and 2650 MHz. The improved RF filter (dashed line) has a significantly improved reflection coefficient in this frequency range, making it suitable for carrier aggregation.

The electro acoustic RF filter and the multiplexer are not limited to the technical details described above or shown in the figures. RF filters can comprise further circuit elements and further resonators. Several electro acoustic RF filters as described above can be used together with each other or with conventional RF filters to establish improved multiplexer circuits and multiplexer components.

LIST OF REFERENCE SIGNS

FC: filter component
CS: carrier substrate
EAR: electro acoustic resonator
SAWR: SAW resonator
IDTS: interdigitated electrode structure
DE: damping and/or dissipation element
AIIE: acoustically inactive impedance element
BE: bottom electrode
TE: top electrode
PM: piezoelectric material
SAC: sandwich construction
BAWR: BAW resonator
TF: thin film layer of a thin film package
C: capacitor
S21: transfer function
S11: reflection factor (at the input port)
S22: reflection factor (at the output port)

In the following, further embodiments are described to facilitate the understanding of the invention:

1. An electro acoustic RF filter, comprising
   an input port and an output port,
   an electro acoustic resonator electrically connected between the input port and the output port,
   an acoustically inactive impedance element electrically coupled to the electro acoustic resonator and
   a damping and/or dissipation element connected to the acoustically inactive impedance element,
   where
   the damping and/or dissipation element is provided and configured to remove acoustic energy from the inactive impedance element by either dissipation of acoustic energy, or by reducing the coupling or by suppressing an acoustic mode.

2. The electro acoustic RF filter of the previous embodiment, where the acoustically inactive impedance element is a capacitance element or an inductance element.

3. The electro acoustic RF filter of one of the previous embodiments, where
   the electro acoustic resonator is a SAW resonator, a BAW resonator or a GBAW resonator and
   the acoustically inactive impedance element comprises an interdigitated electrode structure or two electrodes separated by a dielectric layer between the electrodes.

4. The electro acoustic RF filter of one of the previous embodiments, where
   the electro acoustic resonator has a first layer construction and the acoustically inactive impedance element has a second layer construction and the first layer construction and the second layer construction differ in at least one parameter selected from the number of layers, the thickness of a layer, the material of a layer and the viscosity of a layer.

5. The electro acoustic RF filter of one of the previous embodiments, where the acoustically inactive impedance element has an orientation rotated relative to an orientation of the electro acoustic resonator.

6. The electro acoustic RF filter of one of the previous embodiments, where the damping and/or dissipation element has a higher viscosity than a material in the direct vicinity of the electro acoustic resonator.

7. The electro acoustic RF filter of one of the previous embodiments, where the electro acoustic resonator is arranged in a housing based on a packaging technology selected from a TFAP packaging, a CSSP packaging, a CSSP plus packaging, a DSSP packaging.

8. The electro acoustic RF filter of the previous embodiment, where an element of the housing establishes the damping and/or dissipation element.

9. The electro acoustic RF filter of one of the previous embodiments, where the acoustically inactive circuit element is directly covered by an element of the housing.

10. A multiplexer component comprising an electro acoustic filter of one of the previous embodiments.

The invention claimed is:

1. An electro acoustic RF filter, comprising:
an input port and an output port;
an electro acoustic resonator electrically connected between the input port and the output port;
an acoustically inactive impedance element electrically coupled to the electro acoustic resonator; and
a damping and/or dissipation element connected to the acoustically inactive impedance element, wherein the damping and/or dissipation element is provided and configured to remove acoustic energy from the inactive impedance element by either dissipation of acoustic energy, or by reducing the coupling or by suppressing an acoustic mode.

2. The electro acoustic RF filter of claim 1, wherein the acoustically inactive impedance element is a capacitance element or an inductance element.

3. The electro acoustic RF filter of claim 1, wherein the electro acoustic resonator is a SAW resonator, a BAW resonator or a GBAW resonator, and wherein the acoustically inactive impedance element comprises an interdigitated electrode structure or two electrodes separated by a dielectric layer between the electrodes.

4. The electro acoustic RF filter of claim 1, wherein the electro acoustic resonator has a first layer construction and the acoustically inactive impedance element has a second layer construction and the first layer construction and the second layer construction differ in at least one parameter selected from the number of layers, the thickness of a layer, the material of a layer and the viscosity of a layer.

5. The electro acoustic RF filter of claim 1, wherein the acoustically inactive impedance element has an orientation rotated relative to an orientation of the electro acoustic resonator.

6. The electro acoustic RF filter of claim 1, wherein the damping and/or dissipation element has a higher viscosity than a material in the direct vicinity of the electro acoustic resonator.

7. The electro acoustic RF filter of claim 1, wherein the electro acoustic resonator is arranged in a housing based on a packaging technology selected from a TFAP packaging, a CSSP packaging, a CSSP plus packaging, a DSSP packaging.

8. The electro acoustic RF filter of claim 7, wherein an element of the housing establishes the damping and/or dissipation element.

9. The electro acoustic RF filter of claim 1, wherein the acoustically inactive impedance element is directly covered by an element of the housing.

10. A multiplexer component comprising an electro acoustic filter, the electro acoustic filter comprising:
an input port and an output port;
an electro acoustic resonator electrically connected between the input port and the output port;
an acoustically inactive impedance element electrically coupled to the electro acoustic resonator; and
a damping and/or dissipation element connected to the acoustically inactive impedance element, wherein the damping and/or dissipation element is provided and configured to remove acoustic energy from the inactive impedance element by either dissipation of acoustic energy, or by reducing the coupling or by suppressing an acoustic mode.

* * * * *